United States Patent
Shigihara (10) Patent No.: US 11,967,802 B2
(45) Date of Patent: Apr. 23, 2024

(54) SEMICONDUCTOR LASER DEVICE

(71) Applicant: Mitsubishi Electric Corporation, Tokyo (JP)

(72) Inventor: Kimio Shigihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 384 days.

(21) Appl. No.: 16/603,803

(22) PCT Filed: Sep. 14, 2017

(86) PCT No.: PCT/JP2017/033306
§ 371 (c)(1),
(2) Date: Oct. 8, 2019

(87) PCT Pub. No.: WO2019/053854
PCT Pub. Date: Mar. 21, 2019

(65) Prior Publication Data
US 2020/0335946 A1 Oct. 22, 2020

(51) Int. Cl.
*H01S 5/32* (2006.01)
*H01S 5/065* (2006.01)
(Continued)

(52) U.S. Cl.
CPC .......... *H01S 5/3211* (2013.01); *H01S 5/0653* (2013.01); *H01S 5/2036* (2013.01);
(Continued)

(58) Field of Classification Search
CPC .......... H01S 5/2218–222; H01S 5/0653–0655; H01S 5/2036; H01S 5/205;
(Continued)

(56) References Cited

U.S. PATENT DOCUMENTS 4,128,815 A * 12/1978 Kawaguchi ............... H01S 5/22
372/45.01
5,546,220 A  8/1996 Endo et al.
(Continued)

FOREIGN PATENT DOCUMENTS

DE    10 2013 223 499 A1    5/2015
JP         01183603 A  *  7/1989
(Continued)

OTHER PUBLICATIONS

International Search Report; Written Opinion; and Notification of Transmittal of the International Search Report and the Written Opinion of the International Searching Authority, or the Declaration issued in PCT/JP2017/033306; dated Dec. 5, 2017.
(Continued)

*Primary Examiner* — Joshua King
(74) *Attorney, Agent, or Firm* — Studebaker & Brackett PC (57) ABSTRACT

A semiconductor laser device is provided with a semiconductor layer including an active layer and a plurality of cladding layers sandwiching the active layer. The active layer includes a stripe-shaped active region, a pair of first refractive index regions and a pair of second refractive index regions sandwiching the active layer and the pair of first refractive index regions. When λ is the laser oscillation wavelength, $n_a$ is the effective refractive index of the active region, $n_c$ is the effective refractive index of the first refractive index regions, $n_t$ is the effective refractive index of the second refractive index regions, w is the width of the active region, and m is a positive integer, the semiconductor laser device satisfies $n_a > n_t > n_c$, and the conditions of equations (5), (8) and (9).

4 Claims, 9 Drawing Sheets

(51) Int. Cl.
  *H01S 5/20* (2006.01)
  *H01S 5/22* (2006.01)
  *H01S 5/323* (2006.01)

(52) U.S. Cl.
  CPC .......... *H01S 5/222* (2013.01); *H01S 5/32316* (2013.01); *H01S 2304/04* (2013.01)

(58) Field of Classification Search
  CPC .......... H01S 5/204–2045; H01S 2301/16–166; H01S 5/2018–2031
  See application file for complete search history.

(56) References Cited

U.S. PATENT DOCUMENTS

| | | | | |
|---|---|---|---|---|
| 6,167,072 A * | 12/2000 | Zory, Jr. | .................... | H01S 5/22 372/43.01 |
| 2004/0151223 A1 * | 8/2004 | Yoshida | .............. | H01S 5/34326 372/45.01 |
| 2009/0290612 A1 * | 11/2009 | Yamaguchi | ........... | H01S 5/2231 372/46.012 |
| 2011/0091147 A1 * | 4/2011 | Hashimoto | .............. | G02B 6/42 385/2 |
| 2011/0292774 A1 | 12/2011 | Osawa et al. | | |
| 2014/0098831 A1 * | 4/2014 | Shigihara | .............. | H01S 5/2036 372/36 |

FOREIGN PATENT DOCUMENTS

| | | | |
|---|---|---|---|
| JP | H01-183603 A | | 7/1989 |
| JP | H07-225403 A | | 8/1995 |
| JP | 2000-200940 A | | 7/2000 |
| JP | 2000200940 A | * | 7/2000 |
| JP | 2003-060288 A | | 2/2003 |
| JP | 2003-060308 A | | 2/2003 |
| JP | 2004-200496 A | | 7/2004 |
| JP | 2006-269988 A | | 10/2006 |
| JP | 2013-004855 A | | 1/2013 |
| JP | 2014-078567 A | | 5/2014 |
| JP | 2017-005102 A | | 1/2017 |
| WO | WO-2004105202 A1 * | 12/2004 | ......... H01S 5/32341 |
| WO | 2010/095333 A1 | 8/2010 | |

OTHER PUBLICATIONS

Jerome K. Butler et al.; "Lateral Mode Discrimination and Control in High-Power Single-Mode Diode Lasers of the Large-Optical-Cavity (LOC) Type"; IEEE Journal of Quantum Electronics; Aug. 1984; pp. 879-891; vol. QE-20, No. 8.

G. B. Hocker et al.; "Mode Dispersion in Diffused Channel Waveguides by the Effective Index Method"; Applied Optics; Jan. 1977; pp. 113-118; vol. 16, No. 1.

Office Action issued in JP 2018-512342; mailed by the Japanese Patent Office dated Apr. 17, 2018.

Office Action issued in JP 2018-512342; mailed by the Japanese Patent Office dated Sep. 4, 2018.

Office Action issued in JP 2018-512342; mailed by the Japanese Patent Office dated Jan. 8, 2019.

An Office Action issued by the German Patent Office dated Apr. 9, 2021, which corresponds to German Patent Application No. 11 2017 008 037.1 and is related to U.S. Appl. No. 16/603,803 with English language translation.

An Office Action mailed by the China National Intellectual Property Administration dated Mar. 18, 2021, which corresponds to Chinese Patent Application No. 201780094722.X and is related to U.S. Appl. No. 16/603,803; with English language translation.

An Office Action issued by the German Patent Office dated Aug. 22, 2022, which corresponds to German Patent Application No. 11 2017 008 037.1 and is related to U.S. Appl. No. 16/603,803; with English language translation.

An Office Action issued by the German Patent Office dated Oct. 31, 2022, which corresponds to German Patent Application No. 11 2017 008 037.1 and is related to U.S. Appl. No. 16/603,803; with English language translation.

* cited by examiner

SEMICONDUCTOR LASER DEVICE

FIELD

The present invention relates to a semiconductor laser device.

BACKGROUND

As described in JP 2014-78567 A, a semiconductor laser device is known, which is improved so as to selectively oscillate a lower order mode. The conventional semiconductor laser device according to the above Publication is provided with an active region, cladding regions provided on both sides of the active region and high refractive index regions provided further outside the cladding regions. According to FIG. 10 of the above Publication, the cladding regions are provided particularly by providing grooves in a semiconductor layer so as to sandwich a ridge section. Next to the grooves, there is a terrace section which is higher than the grooves, and a region located below the terrace section is a high refractive index region. Hereinafter, the cladding region will also be referred to as a "groove region" and the high refractive index region will also be referred to as a "terrace region."

A degree of attenuation of an electric field in the groove region can be controlled by appropriately determining a groove width and a groove shape of the groove region. As also described in paragraph 0050 of the above Publication, a loss difference can be provided in each mode in the terrace region in this way. The provision of the loss differences prevents a higher order mode with large loss from being guided and allows selective oscillation of a lower order mode with less loss. By promoting oscillation in the lower order mode while suppressing oscillation in the higher order mode, it is possible to increase brightness of laser light emitted.

CITATION LIST

Patent Literature

[PTL 1] JP 2014-78567 A

SUMMARY

Technical Problem

In the semiconductor laser device according to JP 2014-78567 A, since the loss difference is provided in the terrace region according to the degree of attenuation of the electric field in the groove region, the groove width and groove shape need to be strictly controlled. Furthermore, since the terrace region is a vibration solution, the terrace region has a structure that allows all waveguide modes including fundamental (zero-order) mode to be cut off in principle.

The present invention has been attained to solve the above problem and it is an object of the present invention to provide a semiconductor laser device improved so as to eliminate the necessity for strict control on a groove width and a groove shape and allow selective oscillation of a lower order mode irrespective of loss.

Solution to Problem

A semiconductor laser device according to the present invention includes:

a semiconductor substrate;

a first conductive type cladding layer provided on the semiconductor substrate;

an active layer provided on the first conductive type cladding layer; and a second conductive type cladding layer provided on the active layer, wherein the active layer comprises:

an active region extending in a laser beam emitting direction and having a predetermined width in a width direction perpendicular to the laser beam emitting direction;

a pair of first refractive index regions provided adjacent to the active region in the width direction and extending on both sides of the active region; and a pair of second refractive index regions sandwiching the active region and the pair of first refractive index regions from outside the pair of the first refractive index regions in the width direction, and assuming that $\lambda$ is a laser oscillation wavelength, $n_a$ is an effective refractive index of the active region, $n_c$ is an effective refractive index of the first refractive index region, $n_t$ is an effective refractive index of the second refractive index region, $w$ is the predetermined width of the active region and $m+1$ is an allowable number of modes in the width direction, the semiconductor laser device satisfies:

$$n_a > n_t > n_c \text{ and}$$

$$\left(\frac{2\pi}{\lambda}\right)\sqrt{n_a^2 - n_c^2}\left(\frac{w}{2}\right) > \frac{\pi}{2}$$

$$m \cdot \frac{\pi}{2} \leq \left[\frac{2\pi}{\lambda}\right]\sqrt{n_a^2 - n_c^2}\left[\frac{w}{2}\right] < (m+1) \cdot \frac{\pi}{2}$$

$$\sqrt{n_c^2 + \left[\frac{\lambda}{2w}\right]^2} \leq n_t \leq \sqrt{n_c^2 + m^2\left[\frac{\lambda}{2w}\right]^2}.$$

Advantageous Effects of Invention

Since the electric field in the terrace region becomes an attenuation solution, strict control on the groove width and groove shape is unnecessary. Furthermore, at least a fundamental mode, that is, a zero-order mode is always a waveguide mode and is never cut off. Therefore, the lower order mode can be selectively made to oscillate.

DESCRIPTION OF EMBODIMENTS

First Embodiment

[Structure of Apparatus]

Figure 1:
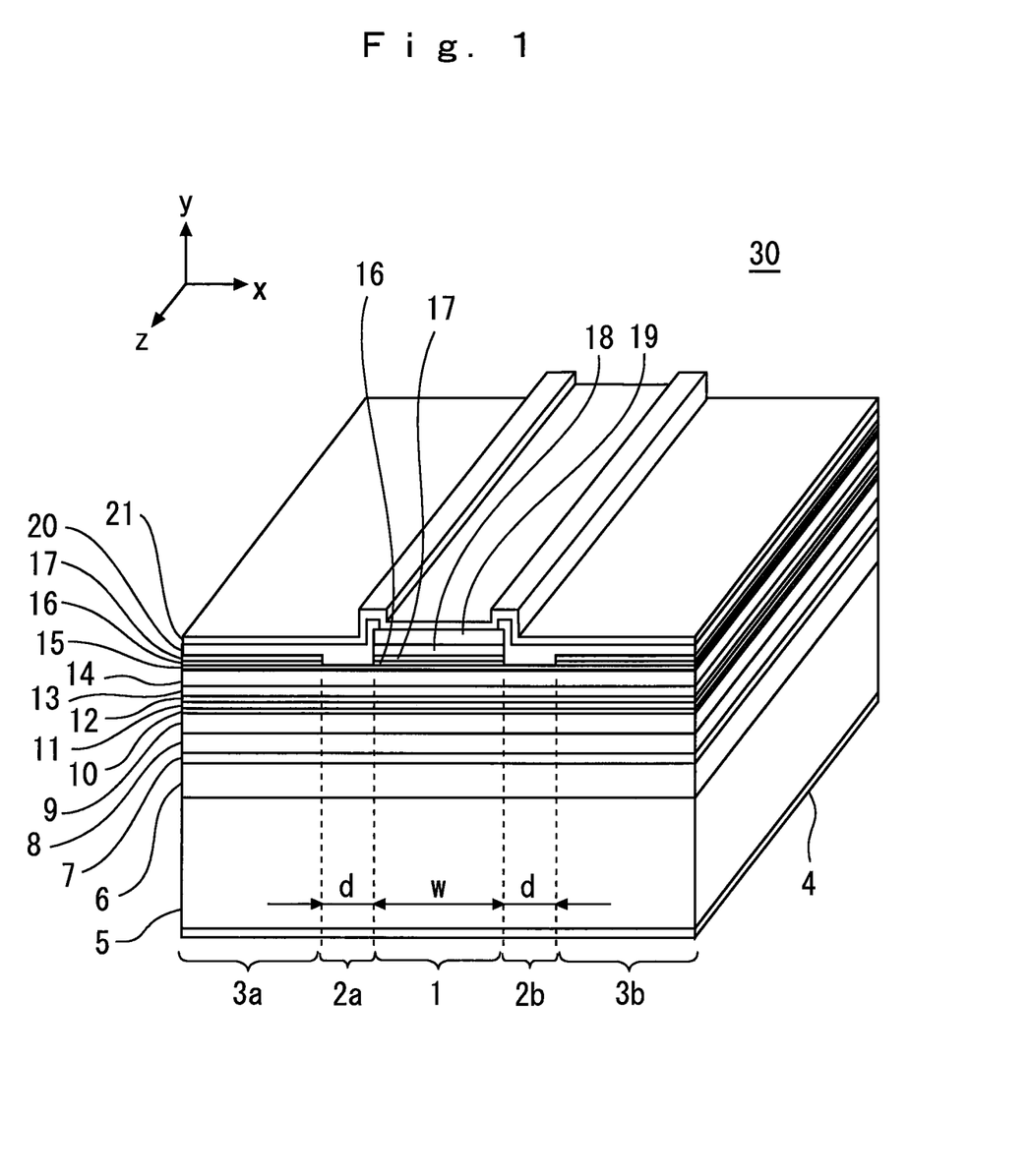
FIG. 1 is a perspective view illustrating a semiconductor laser device according to Embodiment 1 of the present invention.

FIG. 1 is a perspective view illustrating a semiconductor laser device 30 according to Embodiment 1 of the present invention. The semiconductor laser device 30 is provided with an n-type GaAs substrate 5, a first n-type cladding layer 6, a second n-type cladding layer 7, a first n-side guide layer 8, a second n-side guide layer 9, a first barrier layer 10, an active layer 11, a second barrier layer 12, a first p-side guide layer 13, a second p-side guide layer 14, a first etching stop layer 15, a first p-type cladding layer 16, a second etching stop layer 17, a second p-type cladding layer 18, a contact layer 19 and an insulating film 20. The semiconductor laser device 30 is formed by sequentially laminating the first n-type cladding layer 6 to the insulating film 20 on the n-type GaAs substrate 5.

The first n-type cladding layer 6 is made of n-type AlGaAs, having an Al composition ratio of 0.20 and a layer thickness of 1.3 μm. The second n-type cladding layer 7 is made of n-type AlGaAs, having an Al composition ratio of 0.25 and a layer thickness of 0.2 μm. The first n-side guide layer 8 is made of undoped AlGaAs, having an Al composition ratio of 0.16 and a layer thickness of 1.05 μm. The second n-side guide layer 9 is made of undoped AlGaAs, having an Al composition ratio of 0.14 and a layer thickness of 0.1 μm.

The first barrier layer 10 is made of undoped GaAsP, having a P composition ratio of 0.12 and a layer thickness of 8 nm. The active layer 11 is made of InGaAs, having an In composition ratio of 0.12 and a layer thickness of 8 nm. Note that the In composition ratio and the layer thickness are set so that an oscillation wavelength λ is 975 nm. The second barrier layer 12 is made of undoped GaAs, having a P composition ratio of 0.12 and a layer thickness of 8 nm.

The first p-side guide layer 13 is made of undoped AlGaAs, having an Al composition ratio of 0.14 and a layer thickness of 0.35 μm. The second p-side guide layer 14 is made of undoped AlGaAs, having an Al composition ratio of 0.16 and a layer thickness of 0.30 μm. The first etching stop layer 15 is made of p-type AlGaAs, having an Al composition ratio of 0.55 and a layer thickness of 40 nm. The first p-type cladding layer 16 is made of p-type AlGaAs, having an Al composition ratio of 0.25 and a layer thickness of 0.1 μm. The second etching stop layer 17 is made of p-type AlGaAs, having an Al composition ratio of 0.55 and a layer thickness of 40 nm. The second p-type cladding layer 18 is made of p-type AlGaAs, having an Al composition ratio of 0.25 and a layer thickness of 1.4 μm. The contact layer 19 is made of p-type GaAs, having a layer thickness of 0.2 μm. The insulating film 20 is a SiN film. It is possible to calculate refractive indices at a wavelength λ of group III-V mixed crystal such as AlGaAs, InGaAs, GaAsP or the like. For example, a refractive index of the first n-type cladding layer 6 having an Al composition ratio of 0.20 at a wavelength of 975 nm is 3.394762. For more specific calculation, for example, a publicly known technique described in "Semiconductor Laser," written and edited by Iga, PP. 35-38, Ohmsha, Oct. 25, 1994, which is the first Non Patent Literature can be used. The refractive indices of the other layers can also be obtained similarly.

The semiconductor laser device 30 is provided with an n-electrode 4 provided on the back of the n-type GaAs substrate 5 and a p-electrode 21 laminated on the insulating film 20.

In FIG. 1, an xyz orthogonal coordinate system is defined for convenience of description. A z-axis is a direction in which a laser beam of the semiconductor laser device 30 is emitted. The z-axis is also a length direction axis of a Fabry-Perot resonator of the semiconductor laser device 30. The z direction is also referred to as "resonator length direction." The y-axis is assumed to be parallel to a normal of the top surface of the n-type GaAs substrate 5. The y-axis direction coincides with a crystal growth direction of the semiconductor layer formed on the n-type GaAs substrate 5. The x-axis is an axis perpendicular to a yz plane and coincides with a width direction axis of the semiconductor laser device 30. A horizontal lateral mode is generated in the semiconductor laser device 30 along the x-axis. The same rules relating to the above orthogonal coordinate system also apply to FIG. 3, FIG. 6, FIG. 7 and FIG. 8.

An example of the semiconductor laser device 30 according to Embodiment 1 is a broad area type semiconductor laser device having an oscillation wavelength of 975 nm. The broad area semiconductor laser device refers to a semiconductor laser device, a width of an active region of which is 50 μm or more. The semiconductor laser device 30 includes a multi-mode waveguide that allows a plurality of horizontal lateral modes and is a so-called multi-mode semiconductor laser device.

The semiconductor laser device 30 is provided with an active region 1, a pair of first refractive index regions 2a and 2b extending on both sides of the active region 1 and a pair of second refractive index regions 3a and 3b further outside the pair of first refractive index regions 2a and 2b. The active region 1 has a width w. The first refractive index region 2a and the first refractive index region 2b each have a width d. More specifically, the width w of the active region 1 and the width d of the first refractive index regions 2a and 2b are 100 μm and 5 μm respectively.

The active region 1, the first refractive index regions 2a and 2b, and the second refractive index regions 3a and 3b are obtained by dividing the semiconductor layer including the n-type GaAs substrate 5 to the insulating film 20 into a plurality of regions. The active layer 11 is also divided into the active region 1, the first refractive index regions 2a and 2b, and the second refractive index regions 3a and 3b. The first refractive index regions 2a and 2b are also referred to as "cladding regions" or "groove regions" for convenience. The second refractive index regions 3a and 3b are also referred to as "terrace regions." The second refractive index region 3a, the first refractive index region 2a, the active region 1, the first refractive index region 2b and the second refractive index region 3b are arranged side by side in this order in the x-axis direction, that is, in the width direction of the active region 1.

As is clear from the cross-sectional view in FIG. 1, the second refractive index regions 3a and 3b include the first p-type cladding layer 16 and the second etching stop layer 17. The first p-type cladding layer 16 and the second etching stop layer 17 are provided with two grooves each having a width d. The second p-type cladding layer 18 and the contact layer 19 are laminated above a region sandwiched between the two grooves. Thus, the semiconductor laser device 30 includes a ridge section sandwiched between the two grooves having the width d.

As is seen from the cross-sectional view in FIG. 1, the active region 1 is a region below the second p-type cladding layer 18 and the contact layer 19 in the semiconductor laser device 30. The active region 1 is a stripe-shaped region extending along a ridge structure. The pair of first refractive index regions 2a and 2b are regions below the two grooves having the width d and extending on both sides of the active region 1. The pair of second refractive index regions 3a and 3b sandwich the active region 1 and the pair of first refractive index regions 2a and 2b from outside the pair of first refractive index regions 2a and 2b.

An effective refractive index of the active region 1 is assumed to be $n_a$. An effective refractive index of the first refractive index regions 2a and 2b is assumed to be $n_c$. An effective refractive index of the second refractive index regions 3a and 3b is assumed to be $n_r$. A relationship of $n_a > n_r > n_c$ holds in magnitudes of effective refractive indices. Since the active region 1 has higher effective refractive index than the first refractive index regions 2a and 2b, the laser beam is trapped inside the active region 1.

The semiconductor laser device 30 may be manufactured as follows. First, layers such as the first n-type cladding layer 6 to the contact layer 19 are sequentially crystal-grown on the n-type GaAs substrate 5 using a metal-organic chemical vapor deposition (MOCVD) method. Next, a resist is provided on the contact layer 19 so as to cover a location where the active region 1 is to be formed. Dry etching is performed from above the contact layer 19 to the second etching stop layer 17 using the resist. The resist is removed and the active region 1 and the second refractive index regions 3a and 3b are covered with the resist again. Dry etching is performed down to the first etching stop layer 15 so as to provide a groove having a width d and thereby form the first refractive index regions 2a and 2b. Furthermore, the insulating film 20 is formed and the p-electrode 21 and the n-electrode 4 are formed.

Hereinafter, conditions for obtaining the structure of the semiconductor laser device 30 according to Embodiment 1 will be described using FIGS. 2 to 9. The following description will be given with reference to a first comparative example and a second comparative example.

Structure of First Comparative Example

Figure 8:
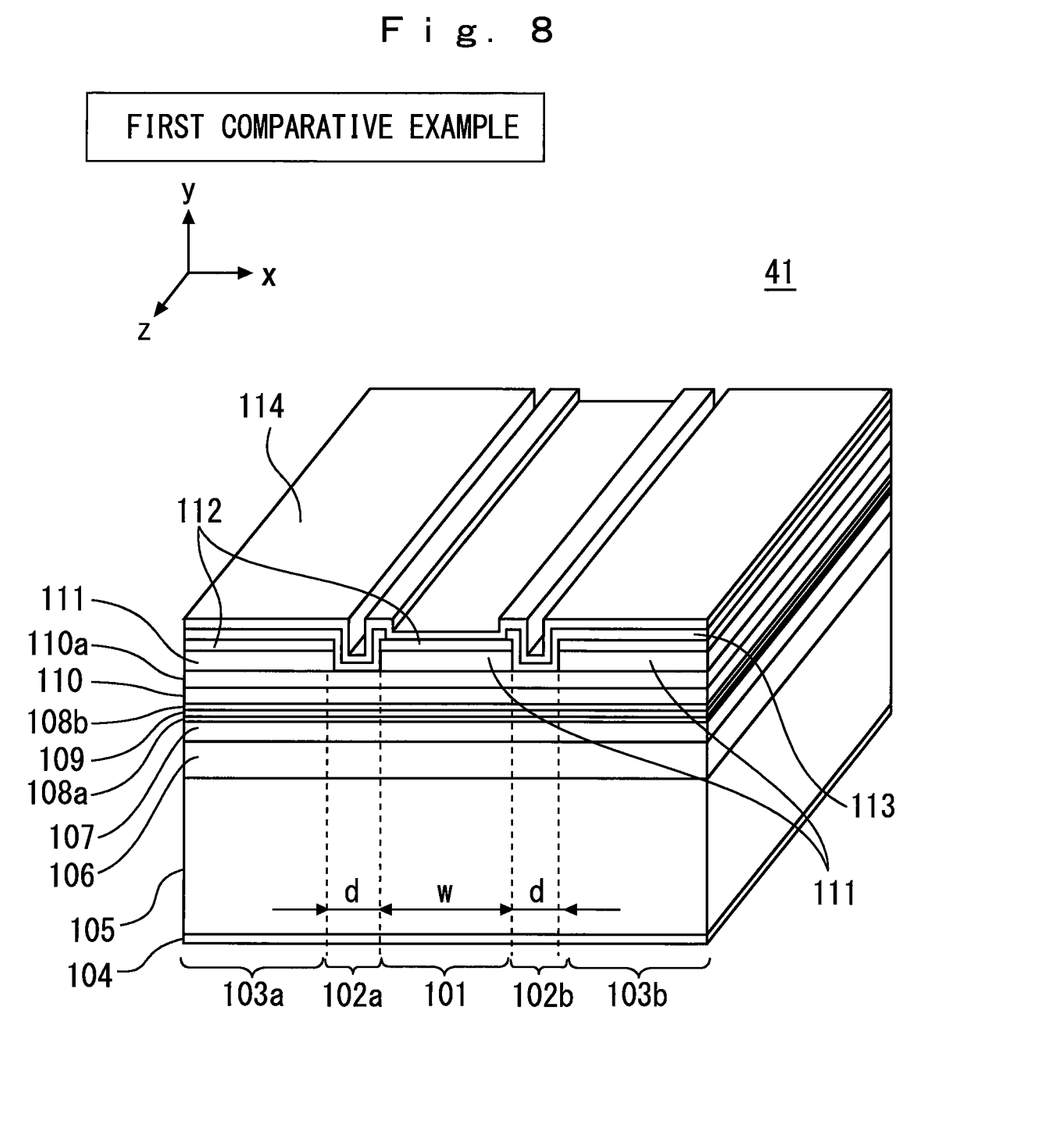
FIG. 8 is a perspective view illustrating a semiconductor laser device according to the first comparative example for the embodiment.
Figure 9:
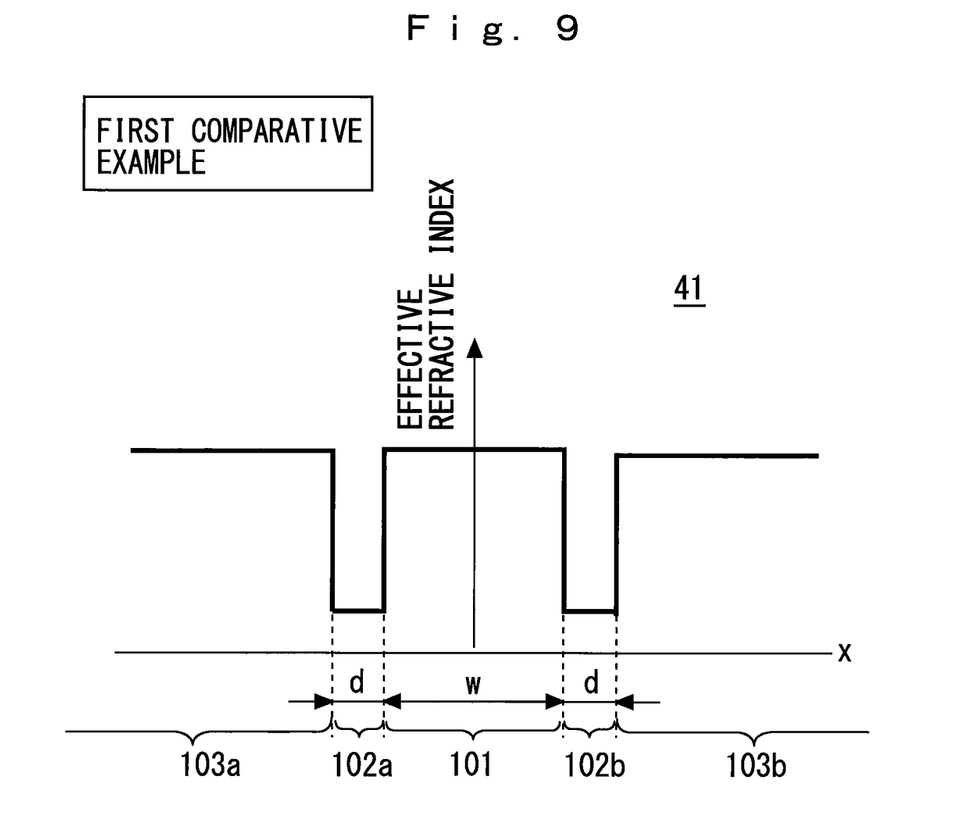
FIG. 9 is a diagram illustrating an effective refractive index distribution in the x direction on the xy plane of the semiconductor laser device according to the first comparative example.

FIG. 8 and FIG. 9 are diagrams relating to the first comparative example. FIG. 8 is a perspective view illustrating a semiconductor laser device 41 according to the first comparative example for the embodiment. The semiconductor laser device 41 shown in FIG. 8 has a structure similar to that of the semiconductor laser device disclosed in FIG. 10 of JP 2014-78567 A.

The semiconductor laser device 41 is provided with an n electrode 104, an n-type substrate 105, a cladding layer 106 made of n-type AlGaAs, a guide layer 107 made of undoped AlGaAs, a well layer 108a made of undoped InGaAs, a barrier layer 109 made of undoped AlGaAs, a well layer 108b made of undoped InGaAs, a guide layer 110 and a guide layer 110a made of undoped AlGaAs, a cladding layer 111 made of p-type AlGaAs, a contact layer 112 made of p-type GaAs, a SiN film 113 and a p electrode 114.

The semiconductor laser device 41 shown in FIG. 8 is provided with an active region 101, first refractive index regions 102a and 102b, and second refractive index regions 103a and 103b. Both the active region 101, and the second refractive index regions 103a and 103b are provided with the n-type substrate 105 to the contact layer 112, and have the same semiconductor layer structure.

FIG. 9 is a diagram illustrating an effective refractive index distribution in the x direction on the xy plane of the semiconductor laser device 41 according to the first comparative example. FIG. 9 is the effective refractive index distribution in the x direction on the xy plane. In FIG. 9, the active region 101 and the second refractive index regions 103a and 103b have the same refractive index. The refractive index of the first refractive index regions 102a and 102b is lower than that of the active region 101 and the second refractive index regions 103a and 103b.

The electric field of the semiconductor laser device 41 according to the first comparative example becomes a vibration solution in the active region 101 and the second refractive index regions 103a and 103b, and becomes an attenuation solution in the first refractive index regions 102a and 102b. In the semiconductor laser device 41, the degree of electric field attenuation is adjusted in the first refractive index regions 102a and 102b. By appropriately controlling the degree of electric field attenuation in the first refractive index regions 102a and 102b, a difference in loss is provided between the higher order mode and the lower order mode so as to reduce loss in the lower order mode while increasing loss in the higher order mode in the second refractive index regions 103a and 103b.

The semiconductor laser device 41 is based on a technical idea of providing a difference in loss in the second refractive index regions 103a and 103b by adjusting the degree of electric field attenuation in the first refractive index regions 102a and 102b and causing the lower-order mode to oscillate. A width w of the active region 101 is 100 μm. A difference in exudation of the electric field is produced between the lower order mode and the higher order mode in the first refractive index regions 102a and 102b on both sides of the active region 101. However, it is when the electric field in the second refractive index regions 103a and 103b becomes a vibration solution that operations and effects according to the first comparative example are expressed.

In the semiconductor laser device 41 according to the first comparative example, loss in the lower order mode is made to differ from loss in the higher order mode in the second refractive index regions 103a and 103b according to the degree of attenuation of the electric field in the first refractive index regions 102a and 102b. A groove for constructing the first refractive index regions 102a and 102b is provided on both sides of the ridge section. The groove width and groove shape of this groove needs to be strictly controlled. Since the electric field is a vibration solution in the second refractive index regions 103a and 103b, this is a structure in which the fundamental (zero-order) mode can also be cut off in principle. The semiconductor laser device 41 according to the first comparative example has a disadvantage that a variation in the groove width and groove shape is likely to cause an increase in loss.

Structure of Second Comparative Example

Figure 3:
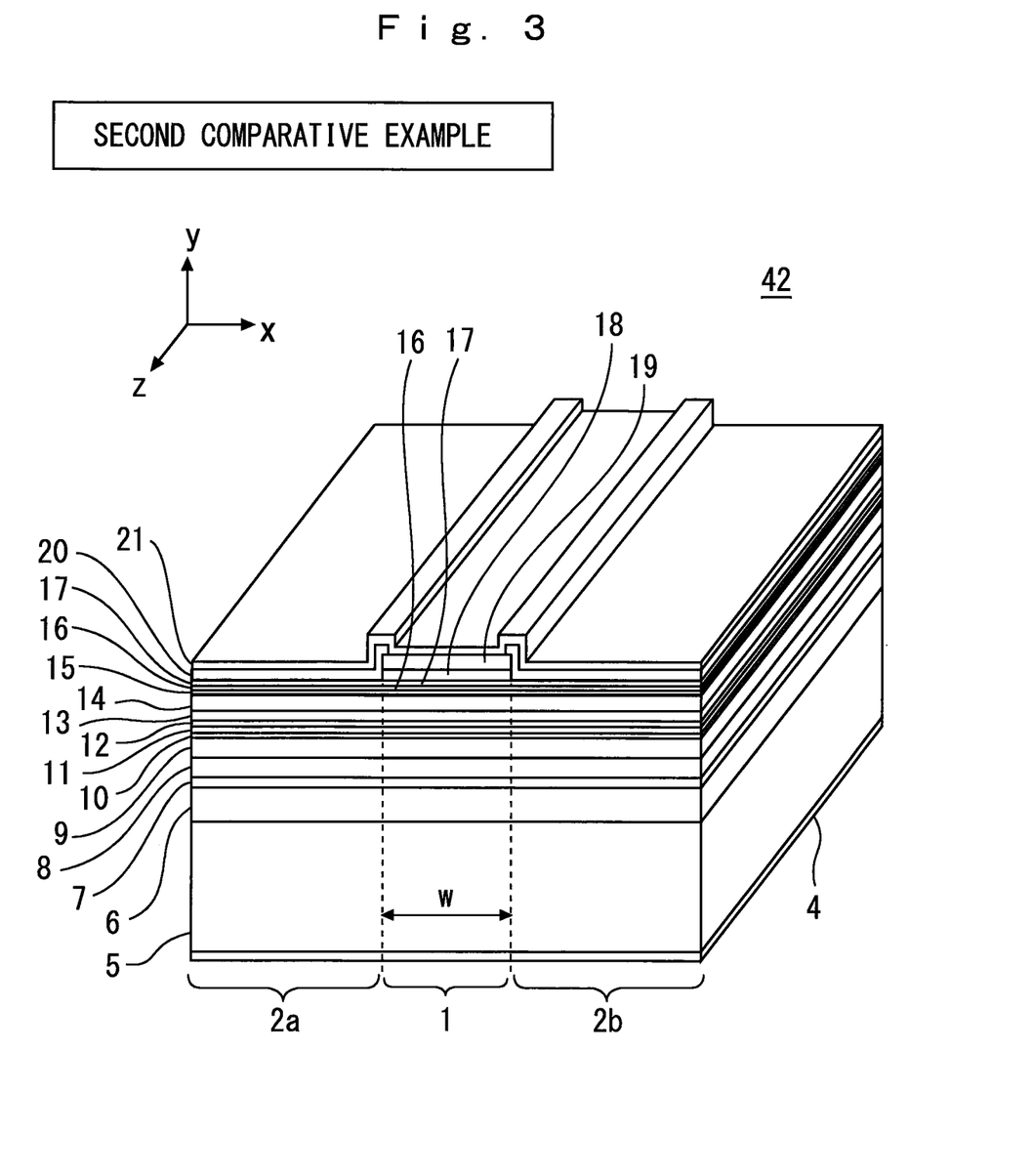
FIG. 3 is a diagram illustrating a semiconductor laser device according to the second comparative example with respect to the embodiment.
Figure 4:
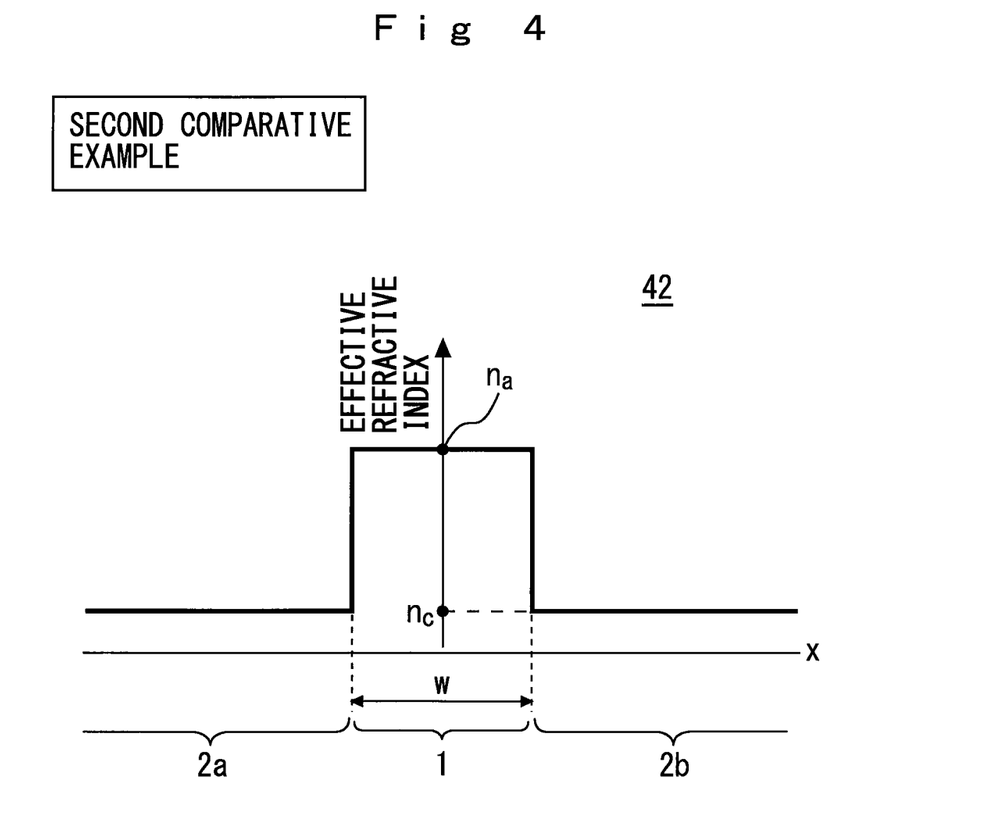
FIG. 4 is a diagram illustrating an effective refractive index distribution in the x direction on the xy plane in the semiconductor laser device according to the second comparative example.
Figure 5:
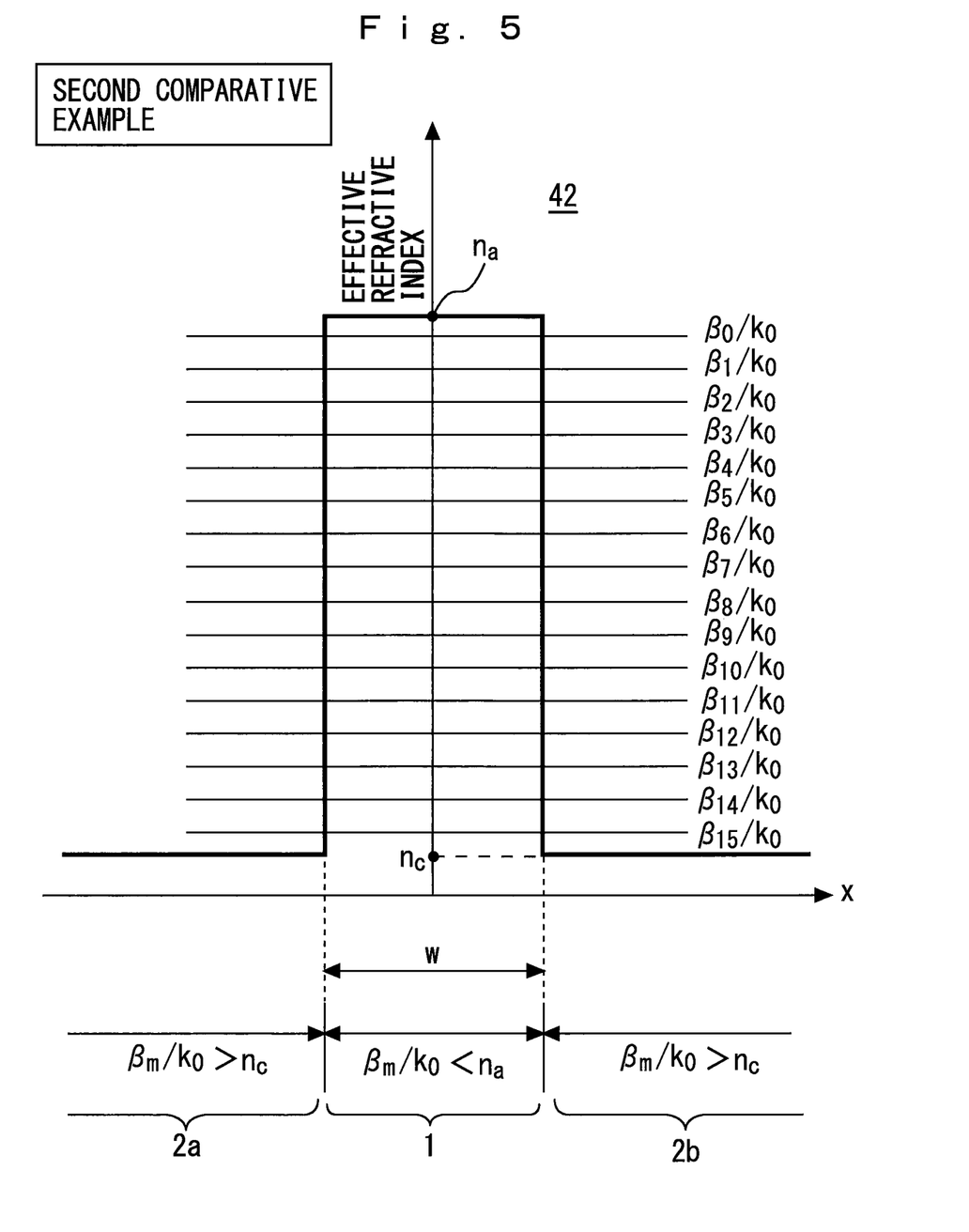
FIG. 5 is a diagram illustrating an effective refractive index distribution in the x direction on the xy plane and a value obtained by dividing a propagation constant in each mode by a wave number in a free space in each mode in the semiconductor laser device according to the second comparative example.

FIG. 3 to FIG. 5 are diagrams relating to a second comparative example. FIG. 3 is a diagram illustrating a semiconductor laser device 42 according to the second comparative example with respect to the embodiment. FIG. 4 is a diagram illustrating an effective refractive index distribution in the x direction on the xy plane in the semiconductor laser device 42 according to the second comparative example. FIG. 5 is a diagram illustrating an effective refractive index distribution in the x direction on the xy plane and a value ($\beta_m/k_0$) obtained by dividing a propagation constant $\beta_m$ in each mode by a wave number $k_0$ in a free space in each mode in the semiconductor laser device 42 according to the second comparative example.

The semiconductor laser device 42 according to the second comparative example is basically provided with a structure similar to that of Embodiment 1. However, as shown in FIG. 3, the semiconductor laser device 42 has no second refractive index regions 3a and 3b. Since there is neither second refractive index region 3a nor 3b, the first refractive index regions 2a and 2b are provided up to side end portions of the semiconductor laser device 42. FIG. 4 illustrates an effective refractive index distribution in the x direction on the xy plane in this case. The effective refractive index $n_a$ of the active region 1 and the effective refractive index $n_c$ of the first refractive index regions 2a and 2b are calculated to be 3.41739 and 3.41658 respectively based on the refractive index and the layer thickness of each layer according to an equivalent refractive index method. More specifically, calculations according to the equivalent refractive index method may be performed using a well-known technique, with reference to, for example, an effective index method disclosed in "G. B. Hocker and W. K. Burns, "Mode dispersion in diffused channel waveguides by the effective index method," Appl. Opt. Vol. 16, No. 1, pp. 113-118, January 1977" which is a second Non Patent Literature.

[Operation of Apparatus]

When two conditions which will be described below are satisfied, a wave equation is expressed as shown in equation (1) below. Note that the wave equation may be derived using a well-known technique with reference to, for example, equation (5) in "W. Streifer and E. Kapon, "Application of the equivalent-index method to DH diode lasers," Appl. Opt. Vol. 18, No. 22, pp. 3724, 15 Nov. 1979" which is a third Non Patent Literature. A first condition is that there is no refractive index change in the resonator length direction (z direction) in which laser beams propagate and the laser beam is uniform. A second condition is that both the active region 1 and the first refractive index regions 2a and 2b on both sides thereof are homogeneous in the y direction as well.

[Math. 1]

$$\frac{d^2\phi(x)}{dx^2} + k_0^2\left(n(x)^2 - \frac{\beta_m^2}{k_0^2}\right)\phi(x) = 0 \quad (1)$$

$\phi(x)$ and $n(x)$ are the electric field distribution and refractive index distribution in the x direction respectively. When the semiconductor laser device is constructed of the first refractive index region 2a, the active region 1 and the first refractive index region 2b as shown in FIG. 3, this configuration can be considered as a three-layer slab waveguide, and the number of modes allowable in the lateral (x) direction is determined by a value v of a normalized frequency shown in equation (2) below.

[Math. 2]

$$V \equiv \left(\frac{2\pi}{\lambda}\right)\sqrt{n_a^2 - n_c^2}\left(\frac{w}{2}\right) \quad (2)$$

In equation (2), $\lambda$ is a wavelength. The number of modes allowable in the x direction of the semiconductor laser device is determined by how many times ($\pi/2$) the v value is. When the v value is k times ($\pi/2$), the allowable number of modes coincides with a number obtained by adding 1 to the value of the integer part of the value k. When w=100 μm and $\lambda$=975 nm are assumed, the v value is 23.98. In this case, since the v value is 15.3 times ($\pi/2$), the zero-order mode and the first-order mode to 15-th order mode are allowed. The allowable number of modes is 16 which is 15+1. When v>($\pi/2$) holds, the v value results in one or more times ($\pi/2$), and so the allowable number of modes is 2 or more.

Each mode has its inherent propagation constant $\beta_m$. The subscript m takes a value like m=0, 1, 2, . . . , 14, 15. In FIG. 5, a value obtained by dividing each propagation constant by a wave number $k_0$ of a free space is overwritten on the effective refractive index distribution. The wave number $k_0=2\pi/\lambda$. The integer m=0 is the zero-order mode, that is, the fundamental mode and m=1 to 15 are the first-order to the 15-th order mode respectively. The value $\beta_0/k_0$ in the fundamental mode has a largest value. As the mode order increases, the value diminishes in order of $\beta_0/k_0>\beta_1/k_0>\beta_2/k_0$ . . . $>\beta_{14}/k_0>\beta_{15}/k_0$. The highest-order mode $\beta_{15}/k_0$ becomes a value close to the effective refractive index $n_c$ of the first refractive index regions 2a and 2b. Because of the nature of the wave equation in equation (1), when $\beta_m/k_0$ is smaller than the effective refractive index, the electric field becomes a vibration solution, whereas when $\beta_m/k_0$ is larger than the effective refractive index, the electric field becomes an attenuation solution. In the active region 1, the electric field becomes a COS-type or SIN-type vibration solution. In the first refractive index regions 2a and 2b, the electric field becomes an exponential-type attenuation solution. Note that in order to become an eigenmode, the electric field needs to converge to zero when x→±∞.

Figure 2:
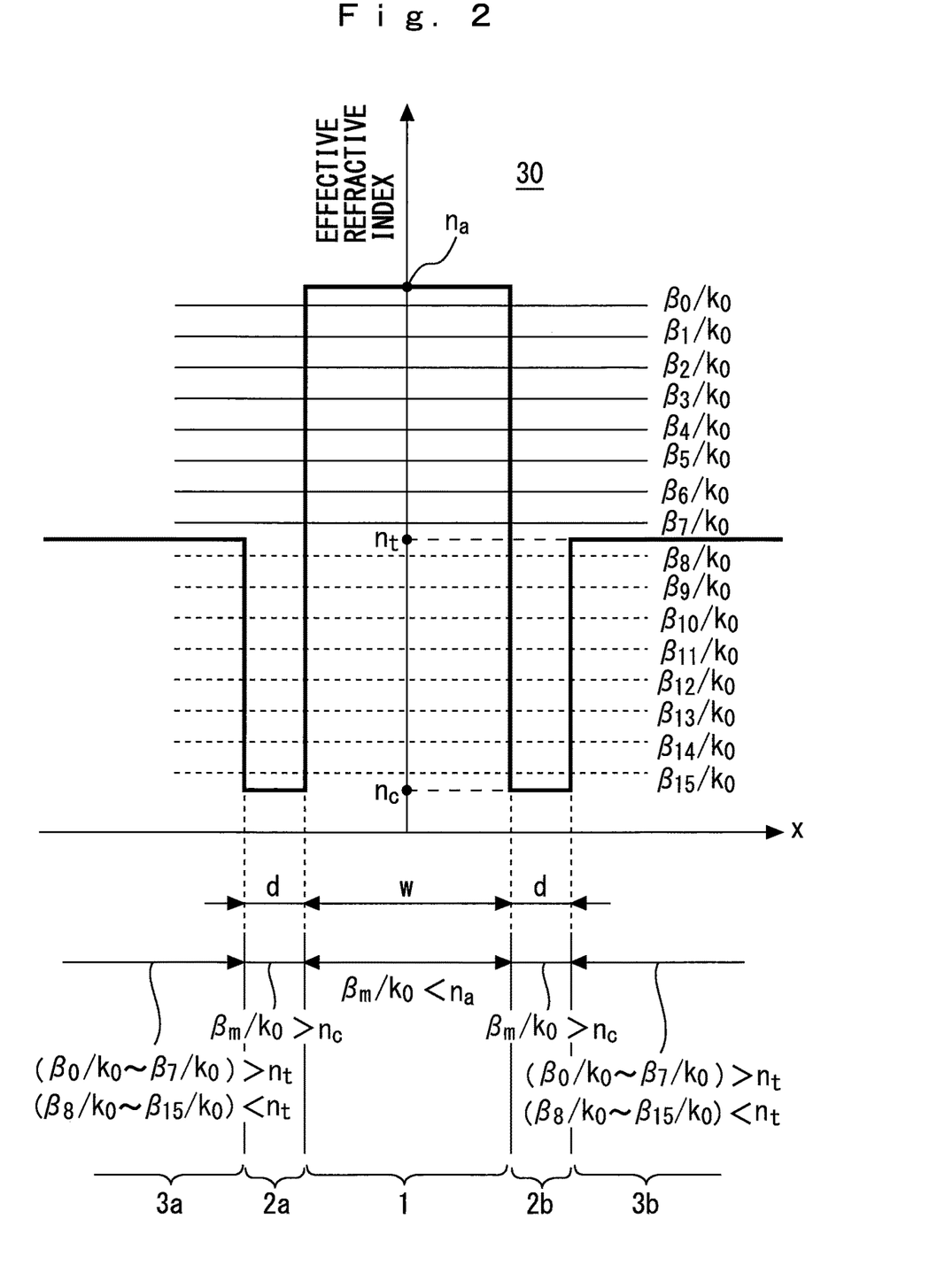
FIG. 2 is a diagram illustrating an effective refractive index distribution in the x direction on the xy plane and a value obtained by dividing a propagation constant in each mode by a wave number in a free space in the semiconductor laser device according to Embodiment 1 of the present invention.

FIG. 2 is a diagram illustrating an effective refractive index distribution in the x direction on the xy plane and a value ($\beta_m/k_0$) obtained by dividing a propagation constant $\beta_m$ in each mode by a wave number $k_0$ in a free space in the semiconductor laser device 30 according to Embodiment 1 of the present invention. The effective refractive index $n_t$ of the second refractive index regions 3a and 3b calculated using an equivalent refractive index method is 3.41716.

In FIG. 2, a value obtained by dividing each propagation constant by a wave number $k_0$ (=$2\pi/\lambda$) in a free space and the effective refractive index distribution are overwritten. Eight modes corresponding to $\beta_0/k_0$ to $\beta_7/k_0$ are larger than the effective refractive index $n_t$ of the second refractive index regions 3a and 3b. The fundamental mode and the lower order mode corresponding to $\beta_0/k_0$ to $\beta_7/k_0$ are eigenmodes in which the electric field becomes an attenuation solution in the second refractive index regions 3a and 3b. On the other hand, eight higher order modes corresponding to $\beta_8/k_0$ to $\beta_{15}/k_0$ are smaller than the effective refractive index $n_t$ of the second refractive index regions 3a and 3b. The higher order modes corresponding to $\beta_8/k_0$ to $\beta_{15}/k_0$ become vibration solutions in the second refractive index regions 3a and 3b and the electric field does not converge to zero when x→±∞, and so the higher order modes cannot become eigenmodes. That is, by providing the second refractive index regions 3a and 3b, the number of modes allowable in the x direction can be reduced to 8.

The higher the mode order, the more the emitted beam spreads. The higher the mode order, the more the far-field pattern (FFP) expands and the lower the brightness becomes as a consequence. When the above second refractive index regions 3a and 3b are provided, it is possible to cut off the higher order mode with large beam expansion and thereby increase the brightness.

Next, the effective refractive index of the second refractive index regions 3a and 3b where at least the fundamental mode always exists and the highest order mode is always cut off will be described. In FIG. 4, it is when equation (3) below is satisfied that the fundamental mode can always exist and the first-order mode is just cut off.

[Math. 3]

$$\left(\frac{2\pi}{\lambda}\right)\sqrt{n_a^2 - n_c^2}\left(\frac{w}{2}\right) = \frac{\pi}{2} \quad (3)$$

At this time, $n_a$ is as shown in equation (4) below.

[Math. 4]

$$n_a = \sqrt{n_c^2 + \left[\frac{\lambda}{2w}\right]^2} \quad (4)$$

That is, when the effective refractive index $n_t$ of the second refractive index regions 3a and 3b is assumed to be $n_t n_a$, at least one $\beta_m/k_0$ is smaller than the effective refractive index $n_t$ of the second refractive index regions 3a and 3b. The mode in which $\beta_m/k_0$ is lower than the effective refractive index $n_t$ becomes a vibration solution in the second refractive index regions 3a and 3b. Such a mode can no longer exist as an eigenmode.

When the normalized frequency v satisfies equation (5), (m+1) modes from the fundamental mode to the m-th order mode are allowed, where m is a positive integer.

[Math. 5]

$$m \cdot \frac{\pi}{2} \leq \left[\frac{2\pi}{\lambda}\right]\sqrt{n_a^2 - n_c^2}\left[\frac{w}{2}\right] < (m+1) \cdot \frac{\pi}{2} \quad (5)$$

A limit that a (m+1)-th order mode is not allowed, that is, an upper limit at which the m-th order mode is allowed is determined by equation (6a) below.

[Math. 6]

$$\left[\frac{2\pi}{\lambda}\right]\sqrt{n_a^2 - n_c^2}\left[\frac{w}{2}\right] = (m+1) \cdot \frac{\pi}{2} \quad (6a)$$

Therefore, when $n_a$ satisfies equation (6b) below, the (m+1)-th order mode is not allowed.

[Math. 7]

$$n_a \leq \sqrt{n_c^2 + (m+1)^2\left[\frac{\lambda}{2w}\right]^2} \quad (6b)$$

Similarly, $n_a$ for which the m-th order mode is not allowed but the (m−1)-th order mode is allowed is determined as shown in equation (7) below.

[Math. 8]

$$n_a \leq \sqrt{n_c^2 + m^2\left[\frac{\lambda}{2w}\right]^2} \quad (7)$$

When the effective refractive index $n_t$ of the second refractive index regions 3a and 3b is caused to fall within a range determined by equation (8) below, $\beta_0/k_0$ of the fundamental mode becomes greater than the effective refractive index of the second refractive index regions 3a and 3b. By so doing, the fundamental mode can always exist as an eigenmode. Furthermore, $\beta_{15}/k_0$ of the highest order mode becomes smaller than the effective refractive index of the second refractive index regions 3a and 3b, and so the highest order mode can reliably be cut off.

[Math. 9]

$$\sqrt{n_c^2 + \left[\frac{\lambda}{2w}\right]^2} \leq n_t \leq \sqrt{n_c^2 + m^2\left[\frac{\lambda}{2w}\right]^2} \quad (8)$$

Note that when the effective refractive index $n_t$ of the second refractive index regions 3a and 3b is caused to satisfy equation (9) below, higher order modes equal to or higher than the first order mode are cut off and oscillation corresponds to only the fundamental mode.

[Math. 10]

$$nt = \sqrt{n_c^2 + m^2\left[\frac{\lambda}{2w}\right]^2} \quad (9)$$

Summarizing design conditions of Embodiment 1, it is assumed that λ is the laser oscillation wavelength, $n_a$ is the effective refractive index of the active region 1, $n_c$ is the effective refractive index of the first refractive index regions 2a and 2b, $n_t$ is the effective refractive index of the second refractive index regions 3a and 3b, w is the width of the active region 1 and m is a positive integer. In this case, the semiconductor laser device 30 according to Embodiment 1 satisfies $n_a > n_t > n_c$ and further satisfies the conditions of equation (5) and equation (8) above and equation (10) below.

[Math. 11]

$$\left(\frac{2\pi}{\lambda}\right)\sqrt{n_a^2 - n_c^2}\left(\frac{w}{2}\right) > \frac{\pi}{2} \quad (10)$$

When the conditions of equation (5), equation (8), and equation (10) are satisfied, the following operations and effects can be achieved in Embodiment 1. First, as a first operation, when equation (10) is satisfied, two or more allowable number of modes are secured. As a second operation, the fundamental mode surely becomes an attenuation solution in the second refractive index regions 3a and 3b, and the fundamental mode can always exist. Furthermore, as a third operation, the highest order mode can be surely set to a vibration solution in the second refractive index regions 3a and 3b, and the highest order mode can always be cut off.

When the electric field is a vibration solution, the electric field repeats COS (cosine)-type or SIN (sine)-type vibration solution in the second refractive index regions 3a and 3b, and never converges to zero when x→±∞, and so the mode cannot exist as an eigenmode (waveguide mode).

Operations and Effects of Embodiment 1

When the effective refractive index $n_t$ of the second refractive index region is caused to satisfy equation (8) above, the fundamental mode always exists as a waveguide mode, and the highest order mode can always be cut off. Furthermore, by setting the effective refractive index $n_t$ of the second refractive index region to a certain constant value in equation (8) above, it is possible to cut off a higher order mode having smaller $\beta_m/k_0$ than the value and cause lower order modes having greater $\beta_m/k_0$ than the value to selectively oscillate. As a result, it is possible to reduce a beam expansion angle in the x direction and increase the brightness.

In the apparatus structure according to Embodiment 1, the first n-type cladding layer 6, the first p-type cladding layer 16 and the second p-type cladding layer 18 are provided as cladding layers. The first n-side guide layer 8, the second n-side guide layer 9, the first barrier layer 10, the active layer 11, the second barrier layer 12, the first p-side guide layer 13 and the second p-side guide layer 14 are provided as layers having a higher refractive index than that of the cladding layers. The sum of layer thicknesses of the "layers having higher refractive index than that of the cladding layers" is set to as thick as 1824 nm. The normalized frequency in the y direction which is a crystal growth direction exceeds π/2. Furthermore, a multimode waveguide is provided for which a plurality of modes are also allowed in the y direction. However, since light confinement in the active layer in the fundamental mode in the y direction is greater than in other modes, the y direction oscillates in the fundamental mode.

90% or more of light intensity in the y direction in the fundamental mode exists in the guide layer having the high refractive index or the like. Since light exudation into the first p-type cladding layer 16 is small, a refractive index difference ($n_a - n_c$) perceived in the x direction between the active region 1, and the first refractive index regions 2a and 2b is small. For this reason, the number of modes allowed in the x direction can be limited to as few as 16.

Without being limited to a so-called LOC (Large Optical Cavity) structure including the thick guide layer shown in Embodiment 1, the semiconductor laser device of Embodiment 1 may be modified to an apparatus structure other than the LOC structure. However, adopting the LOC structure in which a plurality of modes are also allowed in the y direction has an advantage of reducing light exudation into the p-type cladding layer and diminishing the refractive index difference perceived in the x direction. As a result, it is possible to reduce the number of modes allowed in the x direction and easily increase the brightness in the x direction.

In Embodiment 1, by setting the Al composition ratio of the first n-type cladding layer 6 to 0.20 and the Al composition ratio of the first p-type cladding layer 16 and the second p-type cladding layer 18 to 0.25, the refractive index of the first p-type cladding layer 16 and the second p-type cladding layer 18 is caused to be lower than the refractive index of the first n-type cladding layer 6. The light intensity distribution in the y direction becomes an asymmetric distribution that spreads toward the first n-type cladding layer 6 side but steeply decreases on the first p-type cladding layer 16 and second p-type cladding layer 18 sides. Without being limited to such an asymmetric distribution, the semiconductor laser device of Embodiment 1 may be modified to a structure having a y direction light intensity distribution with a symmetric distribution. However, adopting such an asymmetric distribution provides an advantage of being able to reduce light exudation into the p-type cladding layer and diminish the refractive index difference ($n_a - n_c$) perceived in the x direction between the active region 1, and the first refractive index regions 2a and 2b. Reducing the number of modes allowed in the x direction to a relatively small number in advance makes it possible to easily increase the brightness in the x direction.

It is assumed in Embodiment 1 that the first p-type cladding layer 16 has a layer thickness of 0.1 μm. When the thickness of the first p-type cladding layer 16 is made larger than 0.1 μm, it is possible to increase the effective refractive index $n_t$ of the second refractive index region, cut off more higher order modes and selectively oscillate more lower order modes. As a result, the brightness in the x direction can be further increased.

It is assumed in Embodiment 1 that the active region 1 has a width w of 100 μm, but the width w is not limited to this, and there is no problem if the semiconductor laser device is a broad area semiconductor laser device. Moreover, the width d of the first refractive index regions 2a and 2b is assumed to be 5 μm, but without being limited to this, similar effects may be obtained if the width d is generally 10 μm or less.

Second Embodiment

Figure 6:
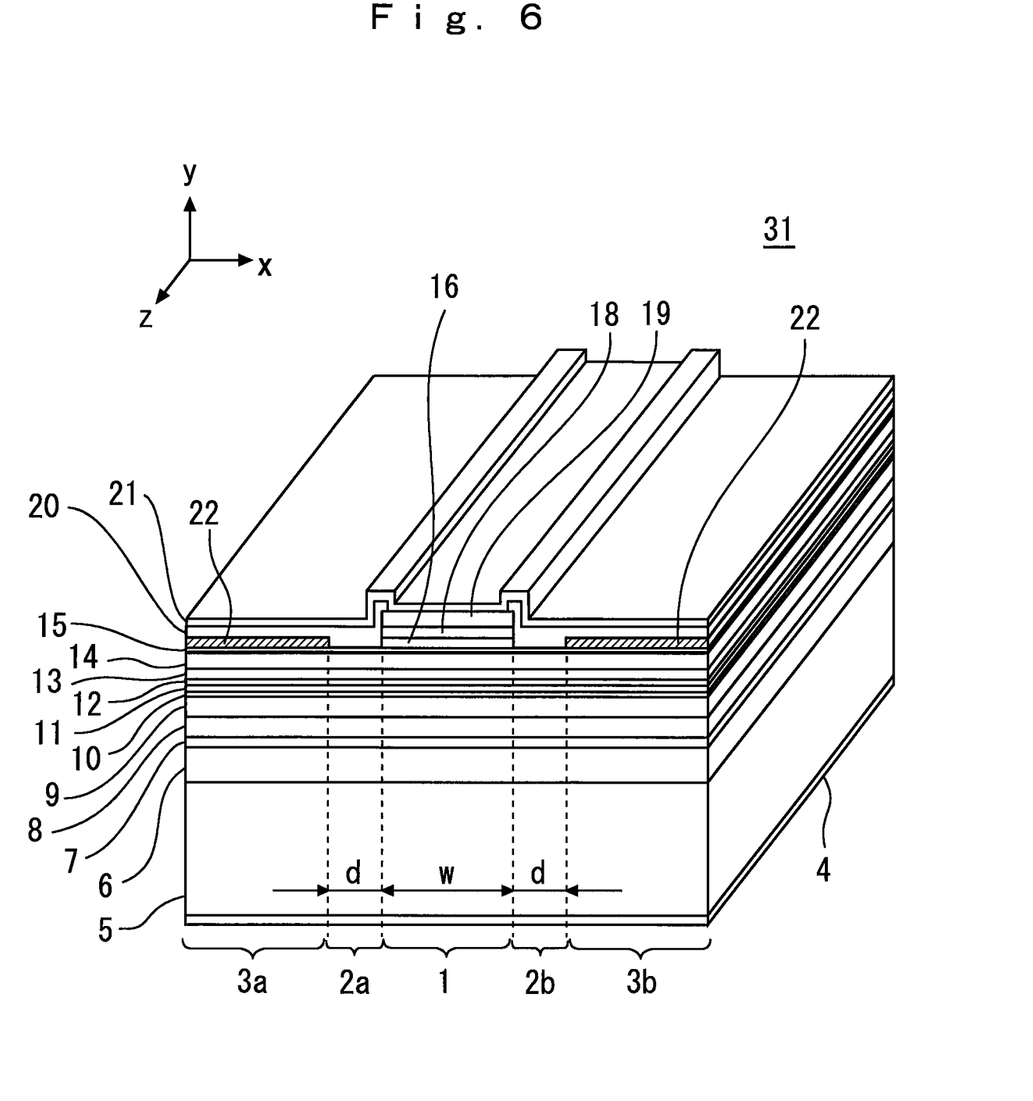
FIG. 6 is a perspective view illustrating a semiconductor laser device according to Embodiment 2 of the present invention.

FIG. 6 is a perspective view illustrating a semiconductor laser device 31 according to Embodiment 2 of the present invention. The semiconductor laser device 31 according to Embodiment 2 has basically the same structure as that of Embodiment 1, but the present embodiment is different from Embodiment 1 in that the first p-type cladding layer 16 and the second etching stop layer 17 included in the second refractive index regions 3a and 3b are replaced by an undoped terrace layer 22. The undoped terrace layer 22 is made of undoped AlGaAs, having an Al composition ratio of 0.25 and a layer thickness of 0.1 μm. In Embodiment 2, etching is performed only once to provide a groove having a width d, and so no second etching stop layer 17 is provided.

The semiconductor laser device 31 according to Embodiment 2 can be manufactured as follows. First, layers such as the first n-type cladding layer 6 to the contact layer 19 are caused to sequentially crystal-grow on the n-type GaAs substrate 5 using a metal-organic chemical vapor deposition (MOCVD) method. Next, a first resist is provided so as to cover a location on the contact layer 19 where the active region 1 is to be formed. Dry etching is performed from above the contact layer 19 to the first etching stop layer 15 using the first resist. Thus, the first p-type cladding layer 16 remains in the location where the active region 1 is to be formed and the first p-type cladding layer 16 is removed from the location where the first refractive index regions 2a and 2b, and the second refractive index regions 3a and 3b are to be formed.

Next, the first resist is removed, the second refractive index regions 3a and 3b are covered with the second resist again to form an insulating film. The insulating film is formed on the first p-type cladding layer 16 and regions protruding by the width d on both sides of the first p-type cladding layer 16. An example of the insulating film is a SiON insulating film. The SiON insulating film covers the active region 1 and the first refractive index regions 2a and 2b. The SiON insulating film serves as a mask when the undoped terrace layer 22 is grown. Then, the undoped terrace layer 22 is caused to grow using the MOCVD method. Since the active region 1 and the first refractive index regions 2a and 2b are masked with the SiON insulating film, the undoped terrace layer 22 can be formed on the second refractive index regions 3a and 3b only. A groove having a width d is formed between the first p-type cladding layer 16 and the undoped terrace layer 22. After removing the SiON insulating film, the insulating film 20 is formed and the p-electrode 21 and the n-electrode 4 are further formed.

In Embodiment 2, a refractive index distribution similar to that of Embodiment 1 can be formed. Therefore, it is possible to obtain an effect of selecting the number of modes similar to that of Embodiment 1 and increase the brightness of the laser beam. Note that although the undoped terrace layer 22 is provided in Embodiment 2 to provide a refractive index only, a p-type AlGaAs layer to which p-type doping is applied may also be provided instead of the undoped terrace layer 22. The material of the undoped terrace layer 22 is not limited to AlGaAs, but other semiconductor crystal materials may also be used, and for example, GaAs may be used.

Embodiment 3

Figure 7:
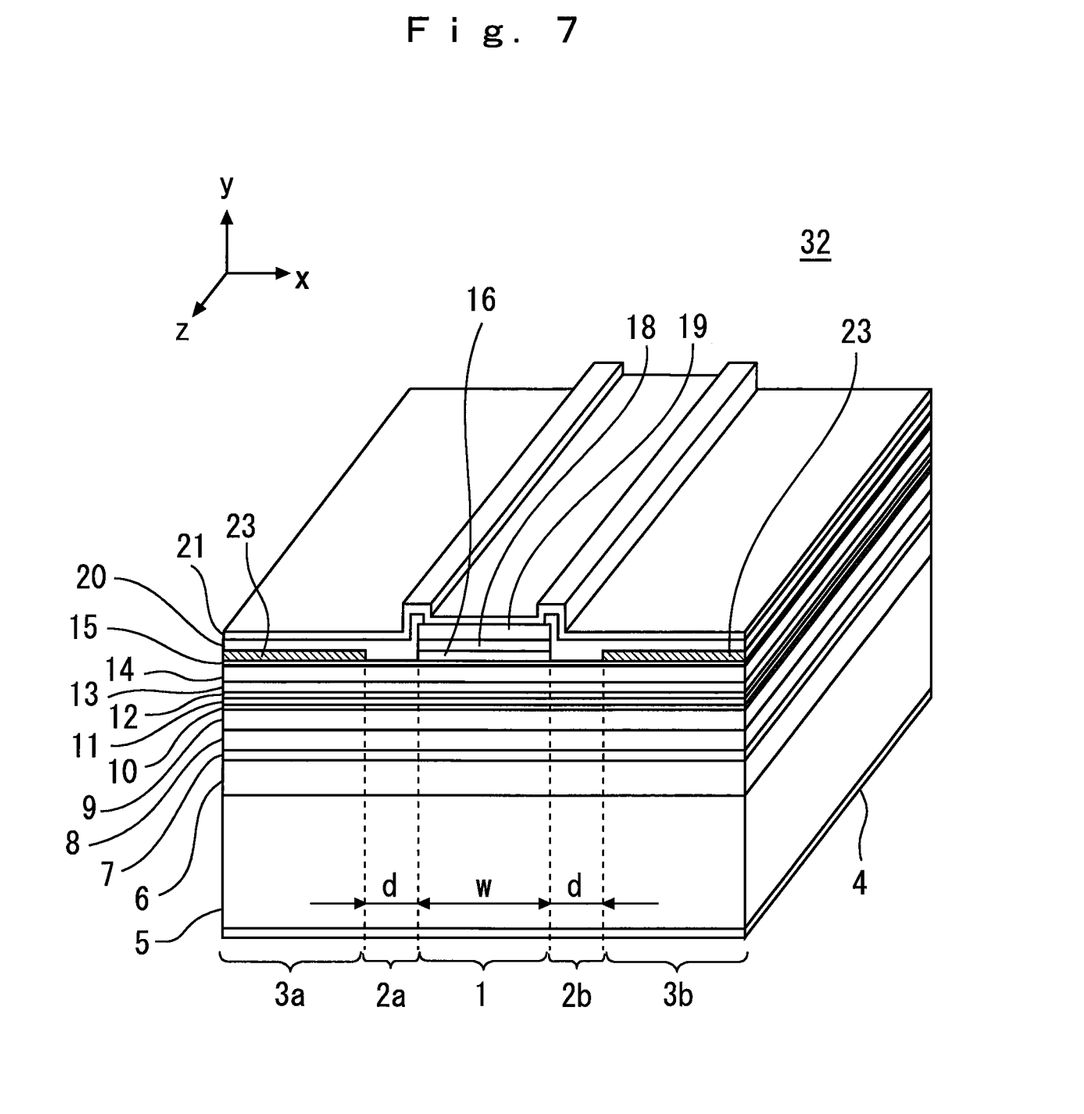
FIG. 7 is a perspective view illustrating a semiconductor laser device according to Embodiment 3 of the present invention.

FIG. 7 is a perspective view illustrating a semiconductor laser device 32 according to Embodiment 3 of the present invention. The semiconductor laser device 32 according to Embodiment 3 has basically the same structure as that of Embodiment 1, but the present embodiment is different from Embodiment 1 in that the first p-type cladding layer 16 and the second etching stop layer 17 included in the second refractive index regions 3a and 3b are replaced by a titanium oxide terrace layer 23. The titanium oxide terrace layer 23 is made of $TiO_2$ and has a film thickness of 0.3 μm.

The titanium oxide terrace layer 23 can be formed using a procedure similar to that of the undoped terrace layer 22 of Embodiment 2. As in the case of the undoped terrace layer 22, a groove having a width d can be formed between the first p-type cladding layer 16 and the titanium oxide terrace layer 23. In Embodiment 3, etching is performed only once to provide a groove having the width d as in the case of Embodiment 2, and so no second etching stop layer 17 is provided.

The refractive index of the insulating film 20 made of SiN is approximately 2.00. In contrast, the refractive index of $TiO_2$ is approximately 2.72 which is higher than SiN, and so, the effective refractive index $n_t$ of the second refractive index regions 3a and 3b can be higher than the effective refractive index nc of the first refractive index regions 2a and 2b. $\beta_m/k_0$ of the higher order mode can be smaller than the effective refractive index $n_t$ of the second refractive index region and the higher order mode is cut off. Since the lower order mode can be made to selectively oscillate, the spreading angle in the x direction is smaller and the brightness can be increased.

The semiconductor laser devices 30 to 32 according to above Embodiments 1 to 3 may be modified as follows. In Embodiments 1 to 3, a semiconductor laser device may be provided in which p-type and n-type conductivities are reversed. In Embodiments 1 to 3, a semiconductor laser device may be provided, a material and structure of which are modified so as to have an oscillation wavelength of other than 975 nm. In Embodiment 1, the higher order mode corresponding to $\beta_8/k_0$ to $0_{15}/k_0$ or less is cut off. In contrast, for each apparatus structure in Embodiments 1 to 3, the value of the effective refractive index $n_t$ to determine cutoff of the higher order mode can be modified in various ways. The value of $n_t$ may be lower than that in Embodiment 1. The $n_t$ may be set so that all the modes other than the fundamental mode are cut off. The $n_t$ may be set so that only the highest order mode is cut off. The value of $n_t$ may be determined so that any number of higher order modes higher in order than the fundamental mode are cut off.

REFERENCE SIGNS LIST 1, 101 active region
2a, 2b, 102a, 102b first refractive index region
3a, 3b, 103a, 103b second refractive index region
4 n-electrode
5 n-type GaAs substrate
6 first n-type cladding layer
7 second n-type cladding layer
8 first n-side guide layer
9 second n-side guide layer
10 first barrier layer
11 active layer
12 second barrier layer
13 first p-side guide layer
14 second p-side guide layer
15 first etching stop layer
16 first p-type cladding layer
17 second etching stop layer
18 second p-type cladding layer
19 contact layer
20 insulating film
21 p-electrode
22 undoped terrace layer
23 titanium oxide terrace layer
30, 31, 32, 41, 42 semiconductor laser device

The invention claimed is:

1. A semiconductor laser device comprising:
a semiconductor substrate;
a first conductive type cladding layer provided on the semiconductor substrate;
an active layer provided on the first conductive type cladding layer; and a second conductive type cladding layer provided on the active layer, wherein
the active layer comprises:
an active region extending in a laser beam emitting direction and having a predetermined width in a width direction perpendicular to the laser beam emitting direction;
a pair of first refractive index regions provided adjacent to the active region in the width direction and extending on both sides of the active region; and
a pair of second refractive index regions sandwiching the active region and the pair of first refractive index regions from outside the pair of the first refractive index regions in the width direction, and
assuming that $\lambda$ is a laser oscillation wavelength, $n_a$ is an effective refractive index of the active region, $n_c$ is an effective refractive index of the first refractive index region, $n_t$ is an effective refractive index of the second refractive index region, w is the predetermined width of the active region and m+1 is an allowable number of modes in the width direction, the semiconductor laser device satisfies:

$$n_a > n_t > n_c \text{ and}$$

$$\left(\frac{2\pi}{\lambda}\right)\sqrt{n_{a2} - n_c^2}\left(\frac{w}{2}\right) > \frac{\pi}{2}$$

$$m \cdot \frac{\pi}{2} \leq \left[\frac{2\pi}{\lambda}\right]\sqrt{n_a^2 - n_{c2}}\left[\frac{w}{2}\right] < (m+1) \cdot \frac{\pi}{2}$$

-continued $$\sqrt{n_c^2 + \left[\frac{\lambda}{2w}\right]^2} \leq nt \leq \sqrt{n_c^2 + m^2\left[\frac{\lambda}{2w}\right]^2}.$$

2. The semiconductor laser device according to claim 1, wherein the effective refractive index of the second refractive index region is:

$$\sqrt{n_c^2 + m^2\left[\frac{\lambda}{2w}\right]^2}.$$

3. The semiconductor laser device according to claim 1, wherein
the second conductive type cladding layer comprises a pair of grooves extending in the laser beam emitting direction and having a predetermined width, and
the first refractive index region is a region below the pair of grooves.

4. The semiconductor laser device according to claim 1, wherein
the width of the second conductive type cladding layer is smaller than the width of the active layer,
a terrace layer made of an undoped semiconductor or titanium oxide is provided on both sides of the second conductive type cladding layer, and
a groove having a predetermined width is provided between the second conductive type cladding layer and the terrace layer.

* * * * *